United States Patent [19]

Kyser et al.

[11] 3,946,398
[45] Mar. 23, 1976

[54] METHOD AND APPARATUS FOR RECORDING WITH WRITING FLUIDS AND DROP PROJECTION MEANS THEREFOR

[75] Inventors: Edmond L. Kyser, Portola Valley; Stephan B. Sears, Belmont, both of Calif.

[73] Assignee: Silonics, Inc., Sunnyvale, Calif.

[22] Filed: June 29, 1970

[21] Appl. No.: 50,445

[52] U.S. Cl. ............... 346/1; 310/8.3; 310/8.6; 310/9.4; 346/75; 346/140 R
[51] Int. Cl.² ........................................ G01D 15/16
[58] Field of Search .......... 346/75, 1, 140; 310/8.3, 310/8.6, 9.4

[56] References Cited
UNITED STATES PATENTS

| | | | |
|---|---|---|---|
| 2,512,743 | 6/1950 | Hansell | 346/75 X |
| 2,951,894 | 9/1960 | Hirsch | 178/5.2 |
| 3,177,800 | 4/1965 | Welsh | 101/1 |
| 3,373,437 | 3/1968 | Sweet et al. | 346/75 |
| 3,452,360 | 6/1969 | Williamson | 346/140 |
| 3,512,173 | 5/1970 | Damouth | 346/75 |

*Primary Examiner*—Joseph W. Hartary
*Attorney, Agent, or Firm*—Limbach, Limbach & Sutton

[57] ABSTRACT

A recording apparatus and method is disclosed which includes a writing fluid source feeding a drop projection means which ejects a series of droplets of writing fluid from a nozzle in a discontinuous stream with sufficient energy to traverse a substantially straight trajectory to a recording medium. The volume of each droplet is individually controlled by electrical pulses applied to the projection means from an electronic driver. A plurality of such projection means may be employed and connected to control means whereby to print or form predetermined graphical intelligence patterns on a record medium.

3 Claims, 11 Drawing Figures

INVENTORS
EDMOND L. KYSER
BY STEPHAN B. SEARS
Limbach, Limbach & Sutton
ATTORNEYS

INVENTORS
EDMOND L. KYSER
BY STEPHAN B. SEARS

Limbach, Limbach & Sutton
ATTORNEYS

METHOD AND APPARATUS FOR RECORDING WITH WRITING FLUIDS AND DROP PROJECTION MEANS THEREFOR

BACKGROUND OF THE INVENTION

This invention relates generally to a non-impact printing apparatus and method and more particularly to an apparatus and method in which the printing fluid is ejected by volume displacement from a nozzle.

Historically printing has been done by applying ink to a specially configured key or carrier and mechanically impacting the key or carrier on a recording medium such as paper to form an impression of the carrier. More recently, non-impact printing devices have been developed, where intelligence patterns (alphanumeric characters, graphical displays, etc.) are deposited on a recording medium. Non-impact printing devices utilize a variety of methods of forming the intelligence patterns, including chemically active and chemically inert processes, using either fluids or solids as the marking or printing medium, and requiring either specially treated recording media or untreated recording media.

It has been known to print by depositing discrete droplets of printing fluid on a recording medium in a predetermined pattern. Previous attempts to achieve such a method of printing utilize a continuous stream of fluid which separates into droplets which are charged and electrostatically deflected so that they form the desired pattern on the recording medium. Such methods produce acceptable resolution only when the charge per unit mass is accurately controlled for each droplet. Two basic variations have been developed: the droplets are either given equal charge per unit mass and then deflected by an electrostatic field whose intensity is controlled by the input signal, or the droplets are given a charge per unit mass according to the input signal and then deflected using a constant electrostatic field. Existing embodiments of both of these methods require that the fluid droplets be uniform, which has proven difficult to achieve. Once the stream of uniform droplets has been attained, it is usually necessary to provide voltages in the range of 2,000 to 10,000 volts for the electrostatic field. Such voltages are difficult and expensive to produce and control. Further, the process of charging the droplets themselves sometimes causes electrolysis of the printing fluid, producing corrosive byproducts which may cause electrode deterioration.

In an effort to obtain droplets of uniform size, two basic methods have been developed in the prior art. First, the printing fluid is delivered to a nozzle at sufficient pressure to assure that a continuous jet of fluid issues from the nozzle. The jet stream is separated into droplets by using radial oscillations or vibrations induced in the nozzle itself by means of magnetostrictive drivers or piezoelectric crystals. The vibrations cause regularly spaced varicosities in the ink stream, aiding the natural tendency of the stream to separate into droplets, and making the ensuing droplets more uniform than would otherwise occur.

In another embodiment of the droplet formation process, the printing fluid is delivered to the nozzle under sufficient pressure to form a meniscus at the nozzle but not high enough to produce flow through the nozzle. In this method, the fluid is drawn from the nozzle electrostatically in a ray-like jet which is then deflected electrostatically as desired. The electrostatic field which draws the jet of fluid from the nozzle is constant, producing a continual stream of printing fluid. The stream breaks into a succession of droplets with essentially uniform mass and charge. A time-varying electrostatic field controlled by an input signal is then used to deflect the droplets as required for the formation of alphanumeric characters. All of the foregoing printing processes and mechanisms make use of a continuous flow of printing fluid, with the flow to be diverted to a reject basin or collector whenever no characters or patterns are to be printed. This results in a more complicated system for handling the flow of printing fluid than would otherwise be required.

In another type of device, piezoelectric transducers are employed to create shock waves in a horn-shaped nozzle. As the waves travel down along the nozzle from the large end to the small end, their intensity increases. The high intensity shock waves serve to eject fluid from the end of the nozzle towards and onto an associated printing medium.

OBJECTS AND SUMMARY OF THE INVENTION

It is a general object of the present invention to provide an improved printing method and apparatus for recording with writing fluids and an improved drop projection means for use with such apparatus.

It is another object of the present invention to provide a drop projection means or head which selectively projects droplets having a controlled volume from a nozzle towards a printing medium responsive to electrical signals.

It is another object of the present invention to provide an improved method and apparatus for recording alphanumeric and graphical intelligence patterns on a recording medium by means of deposition of small droplets of printing fluid on the recording medium in an economical and reliable manner.

It is a further object of the present invention to provide a drop projecting means which projects drops from a nozzle responsive to electrical signals and in which the volume of the drops is controlled by the applied electrical signals.

It is still a further object of the invention to provide a printing apparatus which is simple in construction and reliable in operation.

The foregoing and other objects are achieved by a drop projection means or head in which a nozzle communicates with a fluid chamber fed from an associated fluid reservoir. An electromechanical transducer is associated with one wall of said chamber to rapidly vary the volume of said chamber responsive to electrical pulse signals whereby fluid droplets of volume dependent upon the electrical energy of the signals are ejected from the nozzle. The invention also relates to a printer employing a plurality of such printing heads to print various configurations, such as alphanumeric and graphical intelligence patterns, and to the method of printing such configurations.

DESCRIPTION OF THE PREFERRED EMBODIMENT

Figure 1:
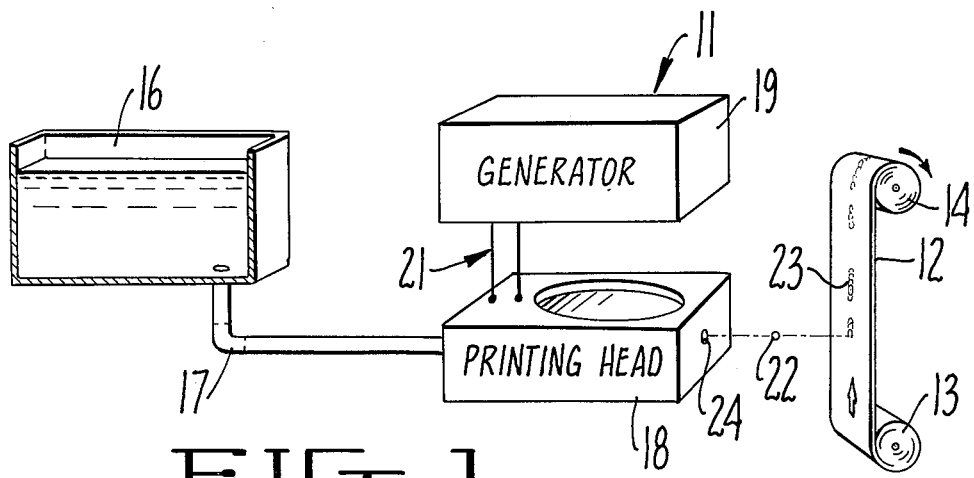
FIG. 1 is a schematic diagram representing a recorder incorporating drop projecting means in accordance with the present invention.

FIG. 1 is a schematic representation of an apparatus 11 adapted to record information on a recording medium 12. The recording medium 12 is shown as moving relative to apparatus 11 from supply roller 13 to take-up roller 14. However, it will be appreciated that relative movement between the apparatus 11 and the recording medium 12 may be in any suitable manner, with actual movement taking place either by the apparatus 11, the recording medium 12 or both.

Apparatus 11 includes an ink reservoir 16 which may be any suitable reservoir for the particular printing fluid used. Ink source 16 feeds through tube 17 to a drop projecting means or printing head 18. An electronic pulse generator 19 applies pulses to the printing head 18 through an appropriate transmission means 21, such as wires. Upon receiving a pulse from driver 19, printing head 18 discharges and projects a single discrete droplet 22 of printing fluid from orifice 24. Each electrical pulse generates a single droplet with the volume of the drop being controlled by the energy of the applied pulse. In the embodiment shown in FIG. 1, the droplets form a line 23 on recording medium 12 as it is moved past the printing head 18.

For accurate recording of information on recording medium 12, a substantially straight trajectory should be followed from orifice 24 on printing head 18 to recording medium 12. In this manner, careful positioning of the recording medium relative to apparatus 11, or vice versa, results in impingement of droplets in a predicatable pattern according to signals generated by electronic driver 19. For the best recording of information, the droplet should be of a precise and predictable shape and volume. That is, each droplet must be exactly like every other and must closely follow the electronic signals from driver 19 so that equally spaced signals give equally spaced droplets of substantially uniform size.

Figure 2:
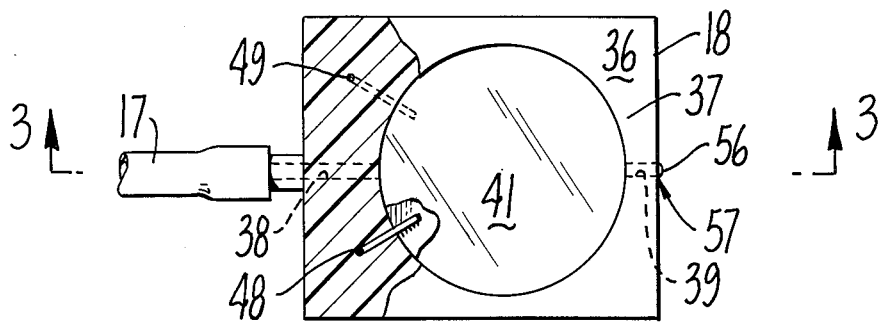
FIG. 2 is a plan view of one embodiment of the drop projecting means shown in FIG. 1.
Figure 3:
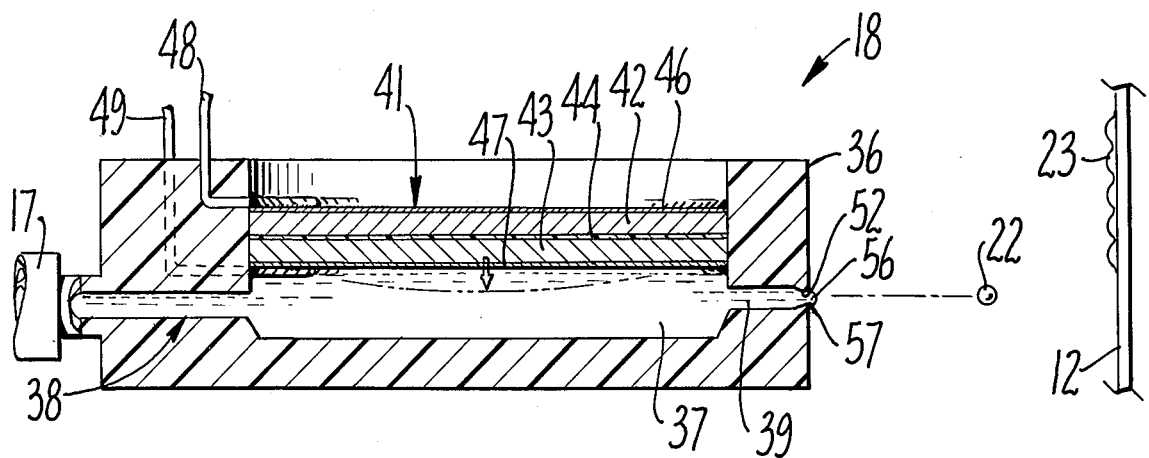
FIG. 3 is a sectional view taken along the line 3—3 of FIG. 2.

Referring to FIGS. 2 and 3, there is shown a preferred drop projecting apparatus or printing head 18. The printing head comprises a housing 36 defining a portion of a pressure chamber 37. Tube 17 provides ink from an ink reservoir 16 to inlet passage 38 of the chamber. The pressure chamber 37 also includes an outlet passage 39. The upper wall of the chamber is formed by a pressure or deflection plate 41. The pressure plate 41 is preferably formed of piezoelectric material. In the embodiment shown the pressure plate consists of two transverse expanding piezoelectric plates 42 and 43 secured to one another by a conductive film 44 which is sandwiched therebetween. The outer surfaces of the plates 42 and 43 are provided with conductive coatings 46 and 47 which provide electrical connection to the faces of the plates and electrical connection is made to the outer conductive coatings by means or wires 48 and 49 whereby a voltage can be applied across the plate by application of voltage to the two faces. Upon application of an appropriate voltage across the plates 42 and 43, plate 42 contracts and plate 43 expands thereby causing the pressure plate 41 to flex inwardly into the pressure chamber and thereby change its volume and displace fluid. This, of course, applies pressure to the printing fluid in the chamber. The application of pressure on the fluid in the chamber 37 forces the fluid through the outlet passage 39 to project towards the printing medium and back along the tube 17 against the hydrostatic head of the fluid reservoir. The end of the passage 39 terminates in an orifice 52 of precise diameter whereby the diameter of the drop forced from the printing head is precisely controlled. Drop size is a function of voltage between plates 42 and 43, pulse length, and the diameter of orifice 52.

The pressure plate 41 is retained in housing 36 by suitable attachment means, such as epoxy resin adhesive and received by the body 36 of the printing head as shown in FIG. 3. A piezoelectric transducer which has been found satisfactory for the pressure plate 41 is sold under the trade name "Bimorph" by Clevite Corporation, Cleveland, Ohio. forms The leads 48 and 49 apply electrical signals from an associated generator 19 to the faces of the pressure plate 41 which, in turn, converts the electrical signal into displacement of the pressure plate which generates pressure in the ink. Preferably the generator 19 provides electrical pulse signals of selected amplitude and duration whereby to control the energy applied to the fluid. These rapid pressure pulses cause single droplets 22 to be ejected from the orifice 52. When no pressure pulse is applied, ink form a slight meniscus 56 extending from the orifice 52 because of the static pressure from reservoir 16 upon the ink in the chamber 37.

Upon application of pulse pressure from the plate 41 ink is ejected from the orifice 52 as discrete droplets responsive to the pulses as shown schematically in FIG. 3. The droplets 22 impinge upon recording medium 12 and relative movement between the printing head and recording medium results in the formation of a line or other configuration depending upon the direction and magnitude of the relative motion between the printing head and the printing medium associated therewith.

The size of the inlet and outlet passages 38 and 39 is controlled to some measure by the viscosity of the ink used. A larger tube would be needed for more viscous ink. When a pressure pulse on plate 41 is ejecting a droplet 22 from outlet orifice 52, the pressure also tends to force ink backwards through inlet passage 38 against the fluid head applied from the reservoir 16. The back flow is limited by controlling the length and diameter of inlet passage 38 so that the frictional retarding force of the fluid limits the amount of back flow during droplet ejection. Fluid flowing in a laminar manner through a tube of length L at a velocity $v$ experiences a frictional retarding force F given by the following equation:

$$F = 8\pi \eta L v,$$

where $\eta$ is the coefficient of viscosity for the fluid. Moreover, the static head on reservoir 16 tends to force droplets out of nozzle 52 instead of back into the inlet tube 38. A static head of 2 inches of water is sufficient for most purposes. If the backflow through inlet passage 38 is not limited, then the pressure pulse from plate 41 may expend significant energy by pushing a large volume of ink back through inlet passage 38 and would be unable to raise sufficient pressure in chamber 37 to eject an ink droplet 22 from the nozzle 52.

The diameter of exit orifice 52 affects the diameter of droplet 22. The length and diameter of passage 39 should be selected so that there will be low frictional losses in comparison to those offered by the pressure head and the passage 38 and tube 17. While a meniscus 56 is formed at orifice 52 when no pressure pulse is applied, surface tension of the ink keeps it from dribbling out of orifice 52. The allowable static pressure which may be applied through reservoir in ink source 16 may be expressed as $$P_{max} = \frac{4S}{D} \quad \text{c.g.s. units}$$

where $D$ is the diameter of orifice 52 and $S$ is the surface tension constant of the ink. However, for the meniscus to be stable at orifice 52, the ink should not wet the front surface of housing 36 on printing head 18. That is, the natural contact angle between the ink and the front surface of housing 36 must be greater than 90°. This condition can be satisfied if water based inks are used and the front surface 57 of housing 36 is coated with Teflon. While a Teflon coating on surface 57 is preferred, there are many other combinations of liquids and solids with a contact angle greater than 90° which would be acceptable for purposes of this invention.

Figure 4:
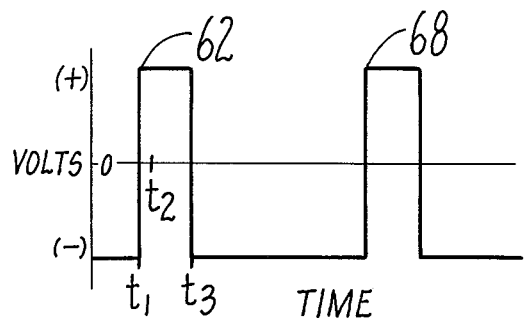
FIG. 4 is a graph showing the voltage applied to the drop projecting means.

FIG. 4 shows input voltage to the crystal (which is translated to pressure on the fluid) as a function of time. The system remains at rest until an input voltage pulse 62 is applied to the plate 41 at $t_1$. This voltage causes the piezoelectric pressure plate 41 (FIG. 3) to deflect, thereby increasing the pressure upon the ink until it is approximately 10 times its static value. Because of the reaction time in deflecting pressure plate 41 and the fluid inertia, application of voltage pulses at time $t_1$ results in a rapid, but not immediate rise in pressure. The pulse is applied until time $t_3$, when the pulse terminates.

Figure 5:
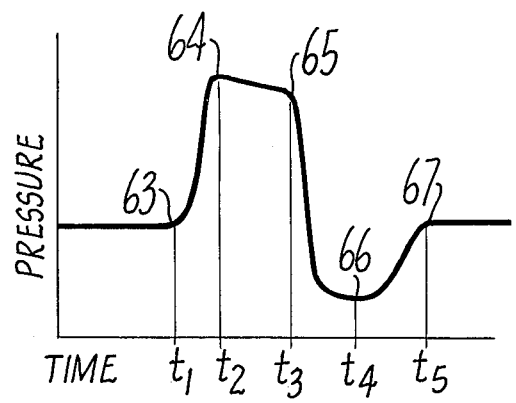
FIG. 5 is a graph showing fluid pressure as a function of time.

The pressure variation is illustrated in FIG. 5 where pressure is at static value 63 at $t_1$ and rises to maximum at 64 at time $t_2$. This high pressure acts as a driving force on the ink in the output orifices 52 accelerating it so that an ink droplet 22 begins to flow out of nozzle 52. Maximum fluid pressure is reached at point 64, but the pressure remains high until point 65 at time $t_3$. As soon as a predetermined time has elapsed, $t_2$ to $t_3$ in FIGS. 4 and 5, the voltage from electronic driver 19 is switched back to its original voltage and the pressure in chamber 37 rapidly drops to beneath its static value at 66 at time $t_4$ and then returns to its static condition 67 at time $t_5$. The column of ink in exit tube 39 is forced from nozzle 52 by the increased pressure at 64 and has attained a high velocity. This high velocity overcomes surface tension at orifice 52 so that a droplet 22 separates from orifice 52 and follows a natural substantially straight trajectory to the recording medium where it forms a dot in the line 23. This process is described in greater detail in connection with FIGS. 6–8. The volume of ink ejected depends in part upon the pulse width of the output, time $t_1$ to time $t_3$ and the value of the voltage; that is, the energy applied. Variation in this length of time may conveniently give droplets having a diameter between 4 mils and 25 mils. The next applied pulse 68 ejects another droplet. Thus the frequency of the droplets is controlled by the frequency at which pulses are applied.

Figure 6:
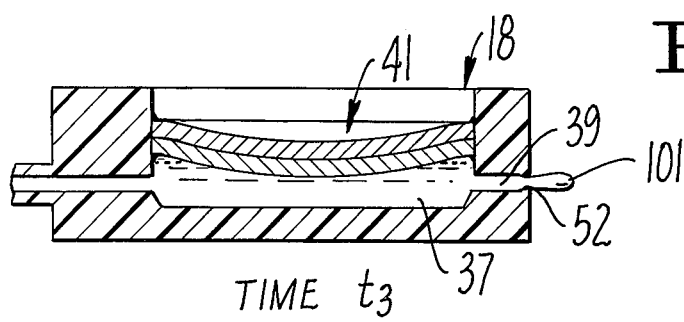
FIG. 6 is a sectional view of the fluid projection means showing the piezoelectric element at maximum deflection.

FIG. 6 is a sectional view of the fluid chamber 37 shown in FIG. 3.

FIG. 6 shows the chamber at time $t_3$ (FIG. 5) when the deflection is at a maximum. The voltage across plate 41 has caused contraction of crystal 42 and expansion of crystal 43 so that the plate deflects into chamber 37, displacing a quantity of ink. Depending upon the static head behind the supply entering at passage 38, the viscosity of the ink, the length and diameter of tube 38 and other considerations described above, a portion of the displaced ink will backflow into tube 17 through passage 38. However, the principal effect of the displacement of the ink in chamber 37 by plate 41 is to force a plug or column 101 out of nozzle 52.

Figure 7:
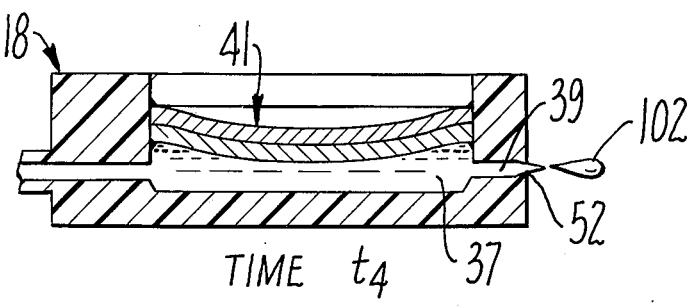
FIG. 7 is a detailed sectional view corresponding to FIG. 6 showing the piezoelectric element returning to its normal position.

FIG. 7 shows pressure plate 41 still at its maximum deflection, but after the voltage supply has dropped at $t_4$ shown at 66 in FIG. 5. Plate 41 is now commencing its return to the rest position since the voltage input to the crystal has reversed again. The acceleration of plug 101 has also reversed. However, a portion of column 101 has attained escape velocity and forms droplet 102. Droplet 102 separates from plug 101, which is deaccelerating, leaving the stud end still communicating with the ink supply within the chamber 37.

Figure 8:
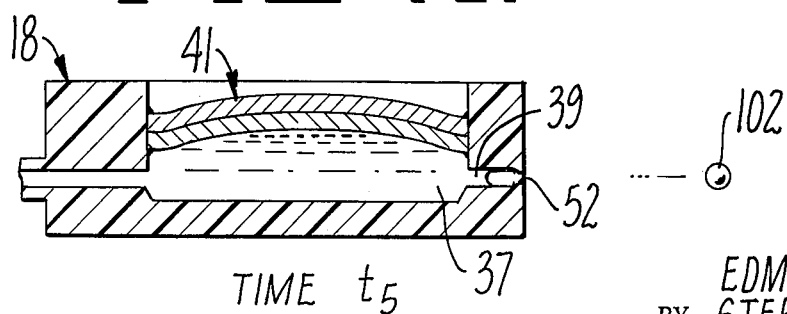
FIG. 8 is a detailed sectional view corresponding to FIG. 6 showing the piezoelectric element in its normal position.

FIG. 8 shows the system at time $t_5$ in FIG. 5. Plate 41 has returned to its ready position at time $t_5$ in the graph shown at 67 in FIG. 5. In the meantime, however, the negative portion of the pressure pulse, 66 in FIG. 5, results in sucking the column of ink 101 back into passage 39 as shown in FIG. 8. At the same time, surface tension of droplet 102 has caused it to form a sphere. The system returns to equilibrium after each pulse which results in formation of a droplet.

The maximum value 64 of the pressure on fluid ink may conveniently be within the range of 1 to 20 psi. By way of example, a specific set of parameters using the apparatus described in FIGS. 1 to 3 to produce high quality ink droplets rapidly is as follows:

TABLE I

| | |
|---|---|
| Printing rate | 1,000 dots/sec. |
| Static pressure | 0.5 p.s.i. |
| Peak pulse pressure | 5.0 p.s.i. |
| Pulse voltage | 180 volts |
| Pulse width | 50 $\mu$ s |
| Orifice diameter | .005 in. |

Figure 9:
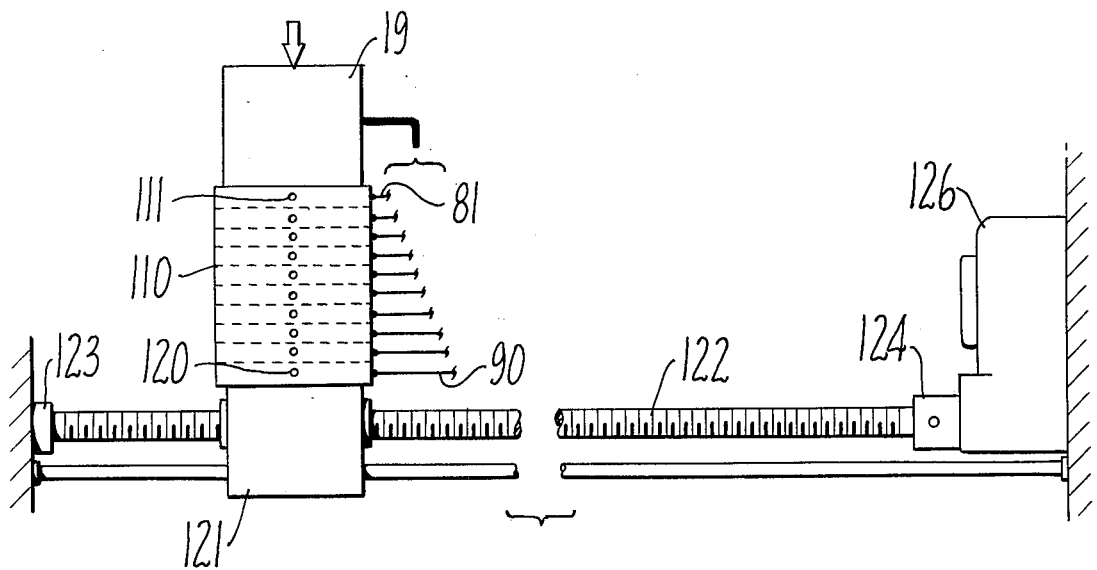
FIG. 9 is a schematic diagram of an apparatus capable of projecting a plurality of droplets on a recording medium.
Figure 11:
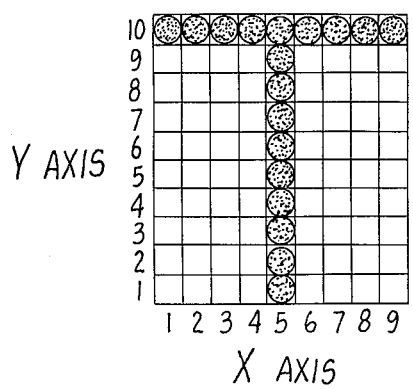
FIG. 11 illustrates a character formed by the recording apparatus schematically illustrated in FIGS. 9 and 10.

FIG. 9 is a schematic diagram of an apparatus similar to that shown in FIG. 1, except that it is capable of printing coherent ink dot patterns, such as alphanumeric characters. This is accomplished by having a series of printing heads 111–120 independently controlled by the electronic driver 19. Printing heads 111–120 are packed vertically in stack 110 so that they may eject from one to ten droplets simultaneously. Let it be assumed that the letter "T" is desired to be printed according to the present invention. FIG. 11 shows how the letter "T" can be constructed from an array of ink dots having nine possible positions on the X axis and ten possible positions on the Y axis. The letter "T" may be formed with the device shown in FIG. 9 by positioning stack 110 at position 1 on the X axis (FIG. 11) and firing printing head 111 so that a dot appears at position ten on the Y axis. Stack 110 is then moved to position 2 on the X axis, printing head 111 is again fired, forming another dot at position 10 on the Y axis. This process is continued until stack 110 is located at position 5 on the X axis, at which time all ten printing heads are fired so that droplets are ejected from each one of printing heads 111 to 120. This forms droplets at positions one through ten on the Y axis to form the vertical component of the letter "T". Thereafter, as stack 110 moves to positions 6 through 9 on the X axis only printing head 111 is fired to print dots at position ten on the Y axis in each case.

While FIG. 9 shows 10 printing heads 111 through 120, it has been found that legible characters can be generated with as few as five vertical positions. However, it is preferred to have between seven and ten positions in the printing head to provide alphanumeric characters having higher resolution.

The stack is mounted on threaded support 121 which cooperates with lead screw 122. The lead screw is rotatably mounted at its ends 123 and 124 and is driven by a stepper motor 126. The number of threads per inch on rod 122 is chosen so that each rotational step of stepper motor 126 moves the printing head horizontally the distance between two adjacent columns on the X axis of FIG. 11. In that manner, each step of stepper motor 126 advances the printing head to the next position along the X axis of FIG. 11.

Figure 10:
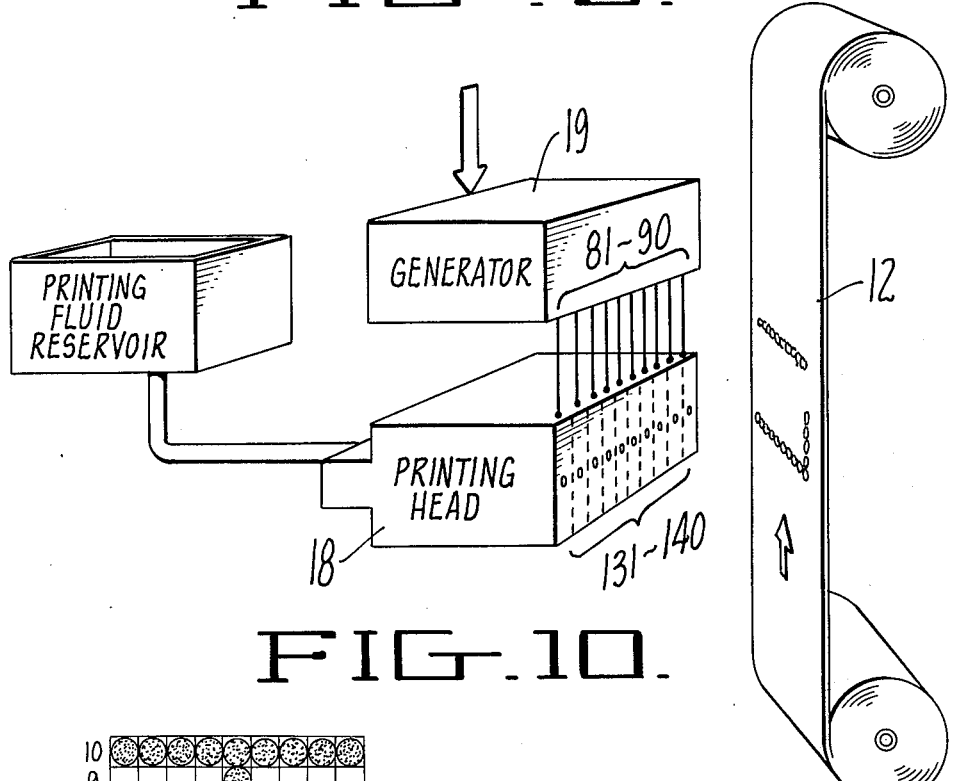
FIG. 10 is a schematic diagram showing another apparatus for projecting a plurality of droplets on a recording medium.

FIG. 10 shows an apparatus in which a plurality of printing heads 131–140 are arranged in side-by-side relationship rather than stacked relationship as in FIG. 9. The recording medium 12 is moved vertically past the heads to print characters and other configurations. It will be understood that the series of printing heads may be oriented either vertically or horizontally, as desired. Thus, a stack of nozzles may be fed from vertically-disposed piezoelectric plates. Likewise, the relative movement between the printing medium and the head may be either vertical or horizontal.

It will, therefore, be apparent that alphanumeric characters may be printed according to the present invention without any impact between the recorder and the recording medium. Individual droplets are ejected over a substantially straight trajectory to the recording medium without the requirement of any electrostatic control or associated high voltages.

We claim:

1. The method of projecting writing fluid droplets from an orifice comprising defining a confined volume of writing fluid, providing an ink reservoir in constant communication with said volume, and suddenly reducing the volume to project droplets from said orifice towards an associated printing medium, one droplet being projected out of said orifice each time said volume is suddenly reduced and wherein the printing rate is between 100 and 3,000 droplets per second.

2. A fluid drop projection means comprising a fluid chamber, an orifice communicating with said fluid chamber, means communicating with said fluid chamber for feeding fluids into said chamber, and volume displacement means responsive to electrical signals for displacing a predetermined volume of fluid in said chamber to eject from said orifice a single droplet of fluid, said volume displacement means including a piezoelectric plate which is deflected into said chamber to displace a volume of fluid responsive to electrical signals applied thereto, said piezoelectric plate being comprised of two transverse expanding piezoelectric plates secured to one another and arranged to expand transversely in opposite directions whereby to deflect responsive to electrical signal applied thereto.

3. Apparatus for recording with writing fluids on a recording medium, comprising:
 a writing fluid chamber formed by walls of a housing, at least a portion of one wall including two transversely expanding piezoelectric plates secured to one another and arranged to expand transversely in opposite directions in a manner to deflect into said fluid chamber in response to electrical energy applied to said piezoelectric plates,
 a passage in another wall of said writing fluid chamber communicating between the fluid chamber and an orifice on an outside surface of said another wall of the housing,
 a fluid reservoir in constant fluid communication with said fluid chamber for supplying writing fluid to said chamber,
 means for applying electric control signals to said piezoelectric plates to cause said plates to deflect inward into said writing fluid chamber to expel a single fluid drop to the outside of said fluid chamber through said orifice each time an electric control signal pulse is applied thereto,
 means disposed opposite of said orifice for holding said recording medium to receive drops of writing fluid discharged through said orifice, and
 means for providing relative movement between said housing and said recording medium, whereby a pattern of fluid droplets may be selectively recorded on said recording medium.

* * * * *